(12) United States Patent
Nakagawa et al.

(10) Patent No.: US 7,022,181 B2
(45) Date of Patent: Apr. 4, 2006

(54) LIQUID PHASE GROWTH PROCESS, LIQUID PHASE GROWTH SYSTEM AND SUBSTRATE MEMBER PRODUCTION METHOD

(75) Inventors: Katsumi Nakagawa, Kyoto (JP); Tetsuro Saito, Kanagawa (JP); Tatsumi Shoji, Kanagawa (JP); Takehito Yoshino, Kyoto (JP); Shoji Nishida, Nara (JP); Noritaka Ukiyo, Nara (JP); Masaaki Iwane, Nara (JP); Masaki Mizutani, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 10/014,418

(22) Filed: Dec. 14, 2001

(65) Prior Publication Data

US 2002/0092464 A1    Jul. 18, 2002

(30) Foreign Application Priority Data

Dec. 15, 2000    (JP)    ............... 2000-382279

(51) Int. Cl.
*C30B 19/00*    (2006.01)
(52) U.S. Cl. ............... 117/54; 117/57; 117/59; 117/60; 117/61; 117/911; 427/430.1
(58) Field of Classification Search ............... 117/54, 117/59, 60, 61, 73, 911, 57; 427/430.1
See application file for complete search history.

(56) References Cited

U.S. PATENT DOCUMENTS

| | | | | |
|---|---|---|---|---|
| 2,759,803 | A | * | 8/1956 | Dauncey ............... 117/60 |
| 3,648,653 | A | * | 3/1972 | Vehse ............... 118/416 |
| 4,191,365 | A | * | 3/1980 | O'Neill ............... 269/46 |
| 4,243,472 | A | * | 1/1981 | O'Neill ............... 117/60 |
| 4,293,371 | A | * | 10/1981 | Kokta et al. ............... 117/60 |
| 5,603,762 | A | * | 2/1997 | Kokune et al. ............... 117/60 |
| 5,902,394 | A | * | 5/1999 | Burkhart et al. ............... 117/13 |
| 6,190,937 | B1 | | 2/2001 | Nakagawa et al. ............... 438/67 |

(Continued)

FOREIGN PATENT DOCUMENTS

EP    1201793 A1 *   5/2002

(Continued)

OTHER PUBLICATIONS

European Patent Office. English Abstract of JP 11-228280 (1999).*

(Continued)

*Primary Examiner*—Robert Kunemund
*Assistant Examiner*—Matthew J. Song
(74) *Attorney, Agent, or Firm*—Fitzpatrick, Cella, Harper & Scinto

(57) ABSTRACT

In a liquid phase growth process comprising immersing a substrate in a melt held in a crucible, a crystal material having been dissolved in the melt, and growing a crystal on the substrate, at least a group of substrates to be immersed in the melt held in the crucible are fitted to the supporting rack at a position set aside from the center of rotation of the crucible or supporting rack, and the crystal is grown on the surface of the substrate thus disposed. This can provide a liquid phase growth process which can attain a high growth rate, can enjoy uniform distribution of growth rate in each substrate and between the substrates even when substrates are set in a large number in one batch, and can readily keep the melt from reaction and contamination even when the system has a large size, and provide a liquid phase growth system suited for carrying out the process.

2 Claims, 13 Drawing Sheets

U.S. PATENT DOCUMENTS

| | | | |
|---|---|---|---|
| 6,258,698 B1 | 7/2001 | Iwasaki et al. | 438/455 |
| 2002/0108559 A1* | 8/2002 | Iwane et al. | 117/54 |

FOREIGN PATENT DOCUMENTS

| | | | | |
|---|---|---|---|---|
| JP | 57095893 A | * | 6/1982 | |
| JP | 7-315983 | | 12/1995 | |
| JP | 10-189924 | | 7/1998 | |
| JP | 11199376 A | * | 7/1999 | |
| JP | 11228280 A | * | 8/1999 | |
| WO | WO 00/71786 A1 | * | 11/2000 | |

OTHER PUBLICATIONS

European Patent Office. English Abstract of JP 11-199376 (1999).*

Patent Abstracts of Japan. English Abstract of JP 57-095893A (1982).*

Journal of Crystal Growth 31 (1975) 358-365, E.A. Giess, "Liquid Phase Epitaxy of Magnetic Garnets".

* cited by examiner

LIQUID PHASE GROWTH PROCESS, LIQUID PHASE GROWTH SYSTEM AND SUBSTRATE MEMBER PRODUCTION METHOD

BACKGROUND OF THE INVENTION

1. Field of the Invention

This invention relates to a liquid phase growth process for producing semiconductor crystals and optical crystals of various types used in semiconductor devices and electro-optical devices, a substrate member production method making use of the process, and a liquid phase growth system suited for carrying out the process.

2. Related Background Art

With an increasing consciousness about environment, e.g., about air pollutions, solar cells have come to be widely used also for public use. Also, in such solar cells for public use, single-crystal or polycrystalline silicon is chiefly used as a semiconductor material. At present, these crystals are cut out of a large ingot in the shape of wafers each having a stated thickness of about 300 μm.

Such a method, however, gives forth cut waste of about 200 μm when each wafer is cut out, and hence utilizes materials in a poor efficiency. Moreover, it requires industrial-waste treatment for the part corresponding to the cut waste. Hereafter, in order to achieve higher production and achieve a low price further, it is desired to grow a crystal in the optically necessary smallest thickness and use such a crystal.

As a method for growing such thin crystal silicon, studies have hitherto been made on a gaseous-phase growth process in which a gas containing silicon is decomposed by the action of heat or plasma. In the mass production of solar cells, a system is demanded which can grow silicon at a rate of 1 μm/minute or higher on tens to hundreds of substrates of 4 to 5 inches square in one batch. However, any gaseous-phase growth system adaptable to such specification has not been put on the market.

As growth processes for crystals, besides the foregoing, a process called a liquid phase growth process is known from old times, and is actually utilized in the manufacture of compound semiconductor crystals for LEDs and optical crystals for electro-optical devices. Nowadays, as disclosed in Japanese Patent Application Laid-Open No. 10-189924, an example is reported in which a silicon crystal film grown on a crystal silicon substrate or a ceramic substrate is utilized for the manufacture of solar cells.

The liquid phase growth process is a process in which a metal such as tin, indium or gallium or an oxide such as lithium acid and niobic acid is heated to melt it, and a material for constituting the crystal, such as arsenic or silicon, is optionally further dissolved therein to form a melt, a substrate is immersed therein, and the melt is super-saturated by a means such as cooling to cause a crystal to deposit on the substrate.

This liquid phase growth process enables growth of crystals in good quality and moreover, compared with the gaseous-phase growth process, may less give force the material that is wasted without contributing to the growth of crystal. Accordingly, this process is suited for the application to devices required strongly to be inexpensive, such as solar cells, and to electro-optical devices in which expensive materials such as gallium and niobium are used.

The liquid phase growth process, however, has hitherto been limited in its use, and apparatus for growing compound semiconductors on substrates of 3 inches or smaller have only been put on the market. In particular, the process has been applied to the growth of silicon only a little.

Taking account of problems in conventional liquid phase growth processes and liquid phase growth systems, the present inventors have made studies on methods necessary for achieving the throughput that is demanded in mass production of solar cells, and on apparatus or systems suited for carrying out the processes.

More specifically, a conventional liquid phase growth system which can grow crystals on a plurality of substrates is constructed, e.g., as shown in FIG. 2. It has a substrate-supporting means (consisting basically of a supporting rack 202 and an up-and-down rod 209), and five substrates 201 are horizontally supported with its supporting rack 202 keeping stated intervals, and are immersed in a melt 204 held in a cylindrical crucible 203 provided in a growth heater 205. Here, the temperature of the melt 204 is appropriately controllable by an electric heater 206. The growth heater 205 is also fitted with a gate valve 207 so as to be opened or closed as occasion calls.

To grow crystals on the substrates 201 by using this growth system, first, dissolving substrates 201' (denoted by reference numeral 201' in order to distinguish it from the growth target substrates) comprised of a crystal material such as silicon are supported with the supporting rack 202 of the substrate-supporting means. These are then immersed in a solution in which a low-melting point metal such as indium or gallium or an oxide such as lithium acid and niobic acid has been dissolved and which has been heated to a stated temperature by the electric heater 206, and the crystal material is dissolved until it comes to stand saturated at that temperature, to prepare the melt 204.

Thereafter, the dissolving substrates 201' are drawn up from the melt 204, and are changed for the growth target substrates 201 to be held in the supporting rack 202 (hence, in the drawing, the growth target substrates 201 and the dissolving substrates 201' are not distinguished from each other). Thereafter, the melt 204 is gradually cooled. At the time it has reached a preset temperature, the supporting rack 202 now holding the growth target substrates 201 is descended to immerse the substrates 201 in the melt, whereupon over-saturated material having become not dissolved completely in the melt begins to deposit on the surface of the substrate 201. Thus, the crystal such as silicon grows on each substrate.

Incidentally, when the substrate 201 used here is polycrystalline or is glass or ceramic, the crystal is grown to be polycrystalline. When the substrate is single-crystal, it can be grown to be single-crystal.

Then, at the time the crystal has grown in a desired thickness, the supporting rack 202 holding the substrates 201 are drawn up. In this system, the substrates 201 are attached to or detached from the supporting rack 202 of the substrate-supporting means in the state the gate valve 207 is kept closed. The gate valve 207 is opened after the atmosphere has been displaced with an inert gas in a load lock chamber 208, and then the supporting rack 202 holding the substrates 201 is descended to the interior of the growth heater 205. Thus, the melt 204 can be prevented from reacting with oxygen and water and from being contaminated.

In the system shown in FIG. 2, the substrates 201 can be set in a larger number as occasion calls. However, experiments made by the present inventors have revealed that it is difficult for the construction of this system to achieve a growth rate which is in-plane uniformly high. FIG. 3 shows in-plane distribution of growth rate where five silicon wafers of 5 inches in diameter are held at intervals of 1 cm and the crystal growth is carried out by means of the above system using an indium solution as the melt and silicon as the crystal to be grown. In FIG. 3, white circles indicate distribution on substrates near to the bottom of the melt; and black circles, distribution on substrates near to the surface layer portion of the melt. Differences between substrates are not so much seen, but only a growth rate of about ⅓ of that at peripheral portion has been attained at the central portion of each substrate.

The growth rate becomes less in-plane non-uniform with a decrease in the cooling rate of the melt, but the growth rate decreases as a whole. Also, the growth rate becomes less in-plane non-uniform with a decrease in the distance between substrates, but substrates that can be set per batch decreases in number, resulting in a decrease in throughput in any case.

The reason why the growth rate is in-plane non-uniform is that any fresh melt can not sufficiently be replenished after the semiconductor materials standing dissolved between the substrates has deposited, and it is considered that, the higher the deposition rate is and the smaller the distance between substrates is, the growth rate is more non-uniform.

In the system shown in FIG. 2, the substrates may be turned during the growth, where the melt containing the silicon in a high concentration is replenished between the substrates, so that the growth rate can be made uniform with ease. This, however, makes it necessary for an up-and-down rod 209 of the substrate-supporting means to make both up-and-down movement and rotational movement. In an attempt to keep the inside of the growth heater hermetic with such construction, the mechanism of the substrate-supporting means must be made large-sized and complicated.

Accordingly, in order to move the melt and the substrate relatively, the substrate may be set stationary and the crucible may be rotated. Rotating a high-temperature crucible is commonly done in single-crystal draw-up systems of the Czochralski method. Techniques which employ this method have already been established.

More specifically, Japanese Patent Application Laid-Open No. 7-315983 discloses a proposal of a case in which the rotation of a crucible is applied in a liquid phase growth system. Setting the substrate stationary and rotating only the crucible can make the substrate-supporting means greatly simple, and is advantageous especially for large-sized liquid phase growth systems. However, in the method in which the crucible is rotated, even though the in-plane distribution of growth rate is relatively good, the growth rate tends to be non-uniform between substrates when the substrates are set in a large number, and any sufficient throughput has not been achieved.

SUMMARY OF THE INVENTION

The present invention was made under the above circumstances. Accordingly, an object of the present invention is to provide a liquid phase growth process which can attain a high growth rate, can enjoy uniform distribution of growth rate in each substrate and between the substrates even when substrates are set in a large number in one batch, and can readily keep the melt from reaction and contamination even when the system has a large size, and to provide a substrate member production method making use of the process and a liquid phase growth system suited for carrying out the process.

To achieve the object, the crucible may be rotated independently from the substrate (preferably without rotating the substrate) to introduce the relative movement made between the melt and the substrate. This can make the rotating mechanism simple. Here, however, if the center of the crucible is in agreement with the center of the substrate, the speed of relative movement between the melt and the substrate at the center of rotation and in the vicinity thereof is so low that the melt, which contains the crystal material in a high concentration, may insufficiently be replenished, so that the crystal growth rate lowers at this part. Hence, it is preferable not to dispose the substrate at the center of rotation.

Especially when a large number of substrates are immersed in the melt, the melt tends to be hindered from flowing even though the crucible is rotated, so that the growth rate tends to become non-uniform. Hence, the substrates should be so disposed as not to hinder the flow of melt as far as possible.

Accordingly, the present invention provides a liquid phase growth process comprising the steps of:

immersing a substrate in a melt held in a crucible, a crystal material having been dissolved in the melt; and growing a crystal on the substrate, wherein;

the process has the step of rotating the crucible independently from the substrate (preferably without rotating the substrate), where the substrate is disposed at a position set aside from the center of rotation of the crucible, and the crystal is grown on the surface of the substrate thus disposed.

The present invention also provides a liquid phase growth process comprising the steps of:

immersing a substrate in a melt held in a crucible, the substrate being supported with a supporting rack, and a crystal material having been dissolved in the melt; and growing a crystal on the substrate, wherein;

the process has the step of rotating the supporting rack, where the substrate is disposed at a position set aside from the center of rotation of the supporting rack, and the crystal is grown on the surface of the substrate thus disposed.

The present invention still also provides a liquid phase growth system comprising a crucible and a substrate-supporting rack, wherein the substrate-supporting rack supports the substrate at a position inside the crucible and set aside from the center of rotation of the crucible or supporting rack.

In the foregoing, as embodiments of the present invention, it is effective for the substrate to be supported with the supporting rack and to be so disposed that the surface of the substrate is in the direction substantially parallel to the flow of the melt in the crucible, at the position set aside from the center of rotation of the crucible or supporting rack, and the crystal is grown on the surface of the substrate thus disposed.

It is also effective that the flow of the melt is chiefly caused by the rotation of the crucible or supporting rack, that a flow adjusting means is provided stationarily in the melt to make the flow of the melt inclined toward the center of rotation and/or the liquid surface of the melt, that a flow adjusting means is provided rotatably in the melt to make the flow of the melt inclined toward the center of rotation and/or the liquid surface of the melt, that the crucible or supporting rack is rotated alternately in the clockwise and anticlockwise directions, or that at least the substrate is caused to move up and down.

It is also herein included as embodiments that at least the substrate is so supported with the supporting rack that the substrate surface stands substantially horizontal, and that at least a group of substrates are arranged keeping stated intervals one another, in the direction which falls at right angles with the axis of the center of rotation of the crucible or supporting rack.

The substrate may also consist of a plurality of groups independent from one another, and all groups are immersed in the same melt. Still also, the groups of substrates may preferably be disposed around the axis at the center of rotation of the crucible or supporting rack.

In the liquid phase growth system, it is effective that the system has a temperature control means by which the melt held in the crucible and having a crystal material dissolved therein is controlled to a preset temperature and a rotating means which rotates the crucible or supporting rack, and the supporting rack supports the substrate in substantially parallel to the flow of the melt in the crucible, that the flow adjusting means comprises a fin set upright from the inner peripheral wall of the crucible toward its center, and/or a fin set upright from the inner bottom surface of the crucible; the former being so set upright as to be in a greater height toward the top of the crucible, and the latter being so set upright as to be in a greater height toward the center of the crucible, or that the flow adjusting means has a rectifying surface which is symmetrical in the clockwise and anticlockwise directions when the crucible or supporting rack is rotated alternately in the clockwise and anticlockwise directions.

It is also preferable as embodiments that, in addition to the crucible which holds the melt, the supporting rack which supports the substrate, and the melt-flow adjusting means, the liquid phase growth system comprises a crystal growth heater which hold these therein, and the crystal growth heater is provided with an opening-closing means which keeps the inside of the heater airtight when the crystal is grown on the substrate, and opens or closes the heater when the substrate is brought in or brought out.

DESCRIPTION OF THE PREFERRED EMBODIMENTS

Figure 1A:
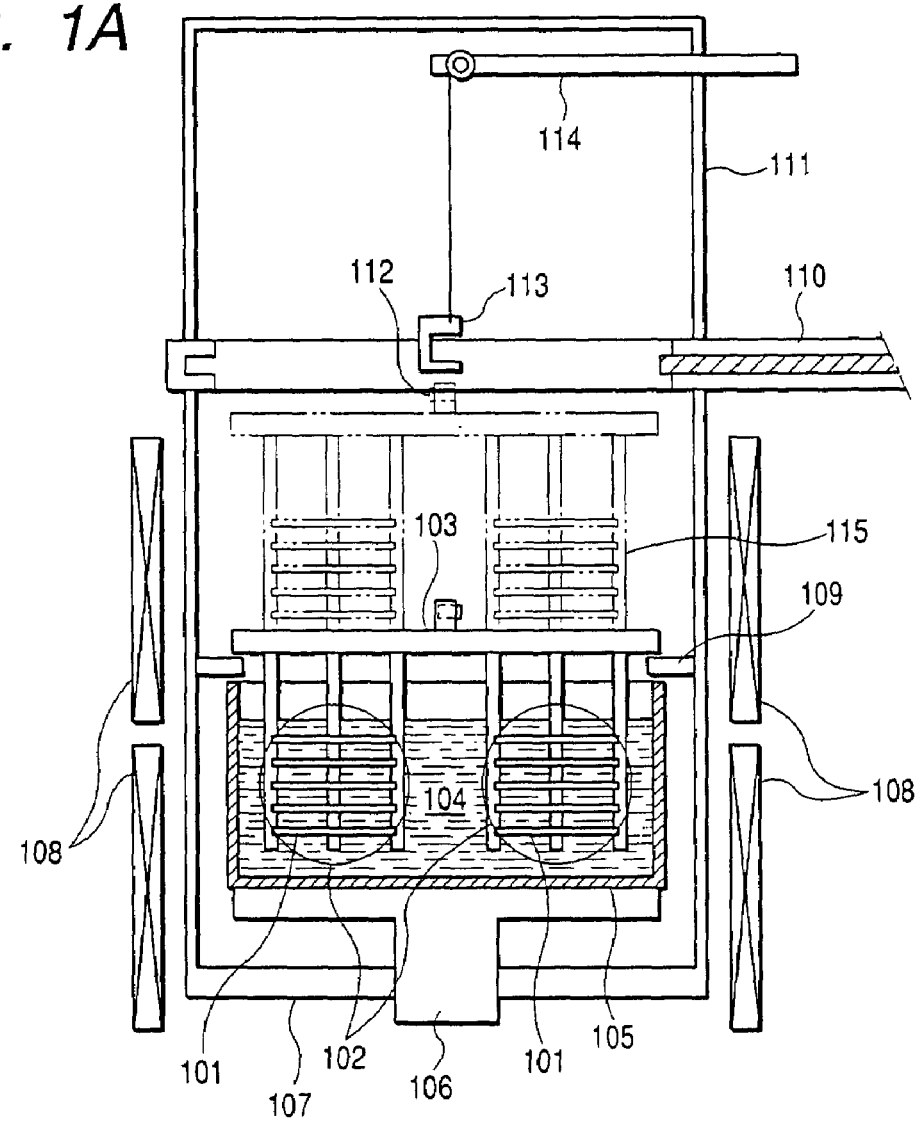
FIGS. 1A and 1B illustrate a liquid phase growth system showing an embodiment according to the present invention.
Figure 1B:
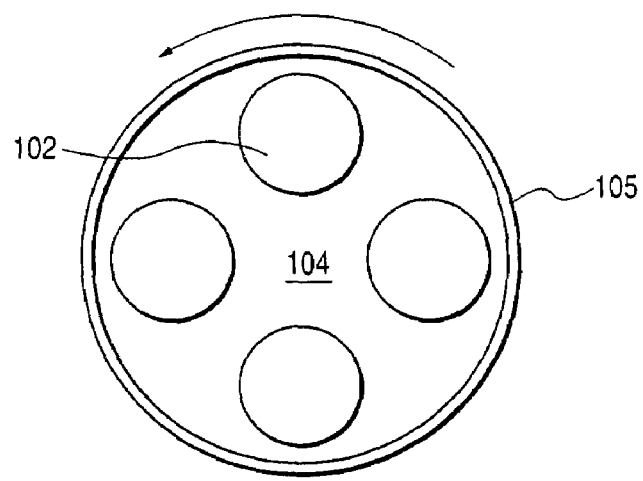

Embodiments according to the present invention are described below in detail. An example of a liquid phase growth system the present inventors have invented is shown in FIGS. 1A and 1B. In this example, the system has a substrate-supporting means consisting basically of a supporting rack 103 and an up-and-down mechanism 114, and twenty substrates 101 are supported with the supporting rack 103 of the substrate-supporting means, in the state of which they are immersed in a melt 104. In this embodiment, five substrates (wafers) constitute a group 102 in which they keep stated intervals in parallel, and also four sets of groups 102 are disposed in a crucible 105 at a stated distance away from its center. That is, the substrate are disposed at a position set aside from the center of rotation of the crucible at which the melt flows slowly, and hence any great non-uniformity of growth rate can be avoided.

In the gist of the embodiment, the substrate group 102 may be provided in at least one set. If, however, it is the case, the substrates which can be set are in a small number for the size of the crucible 105. Hence, as shown in FIGS. 1A and 1B, a plurality of substrate groups 102 may preferably be disposed around the center of rotation of the crucible.

In this example, all the substrates are perfectly horizontally supported. The substrates 101 may also be inclined by about 5 to 10 degrees, where the melt can smoothly flow to the substrate surfaces when the substrates are put in or put out of the melt 104 (up-and-down motion). The inclination by such degrees may by no means obstruct the flow of melt that has been caused by the rotation of the crucible 105.

The crucible 105 holding the melt 104 therein is put on a stage of a rotating means 106, and is rotated at a stated number of revolutions. The whole of these is kept received in a growth heater 107. Also, the melt 104 is temperature-controlled by heating means 108 such as electric heaters. A supporting member 109 is also fitted in the interior of the growth heater 107 so that the supporting rack 103 of the substrate-supporting means can be placed thereon. The growth heater 107 is fitted with a gate valve 110 which can open or close the growth heater 107. It can close the growth heater 107 after the supporting rack 103 of the substrate-supporting means has been received therein, to keep the inside airtight, or, as occasion calls, can open it so that the supporting rack 103 of the substrate-supporting means can be put in or out.

In the substrate-supporting means, a hanging member 112 provided to its supporting rack 103 is caught with a hook 113, and an up-and-down mechanism 114 fitted to a load lock chamber 111 is operated so that the supporting rack 103 can be put in or put out of the growth heater 107. With such construction, the growth heater can be kept airtight with ease in the course of crystal growth. Moreover, the up-and-down mechanism 114 of the substrate supporting means can be made small-sized and simple, and hence, this is suited especially when it is applied in large-sized systems. Also, the up-and-down mechanism 114 can be so operated that the supporting rack 103 is held at an intermediate position 115. The substrates 101 may be held at this position before they are immersed in the melt 104, and, after the temperature of the substrates 101 has come to a preset temperature, may be immersed in the melt 104, whereby the initial stage of liquid phase growth can be controlled in a good reproducibility. Also, after the substrates 101 have been drawn up from the melt 104, they may be held at the intermediate position 115 for a while. This is effective for removing any melt remaining on the substrate surfaces.

Figure 2:
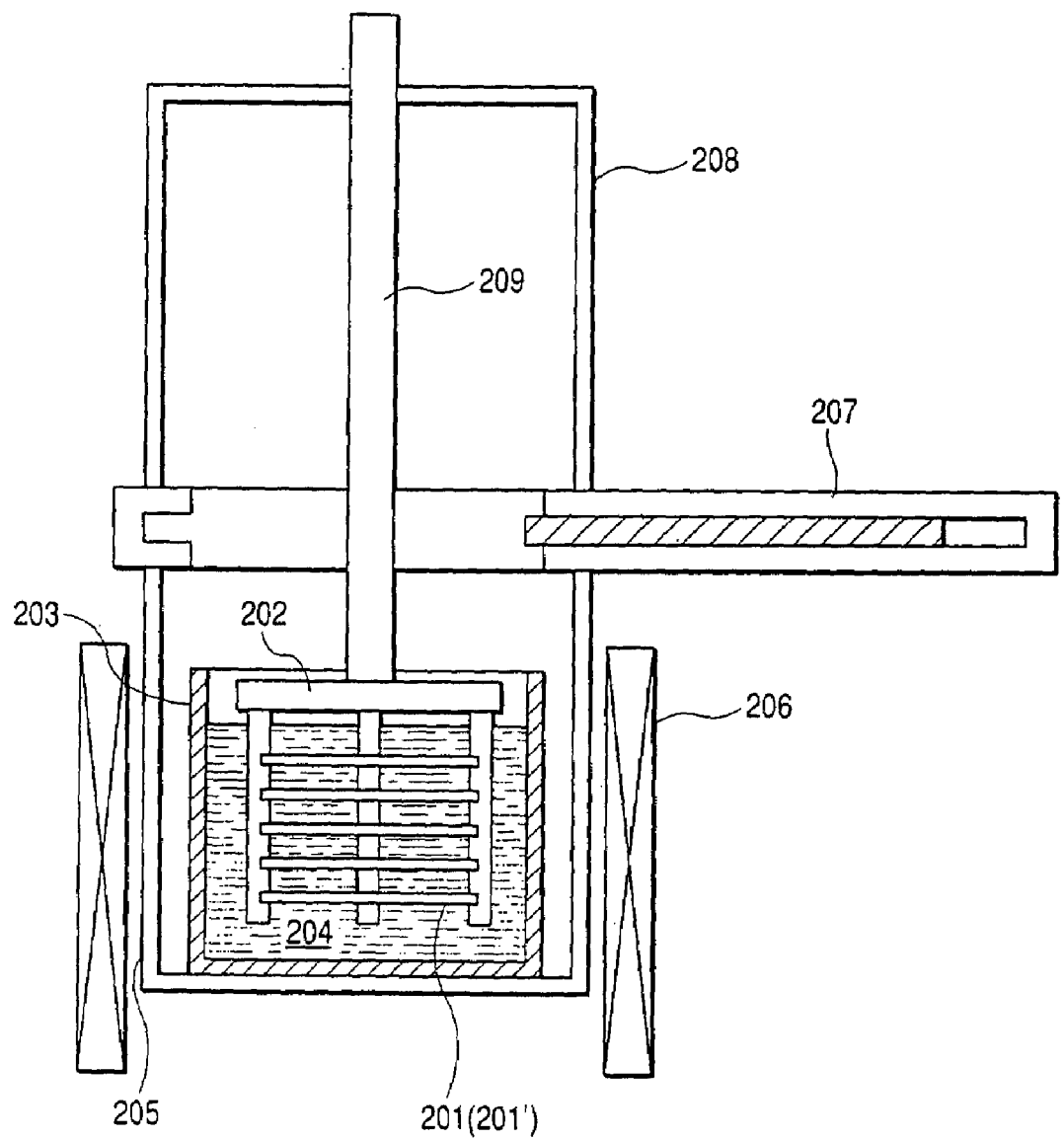
FIG. 2 illustrates an example of a conventional liquid phase growth system.
Figure 3:
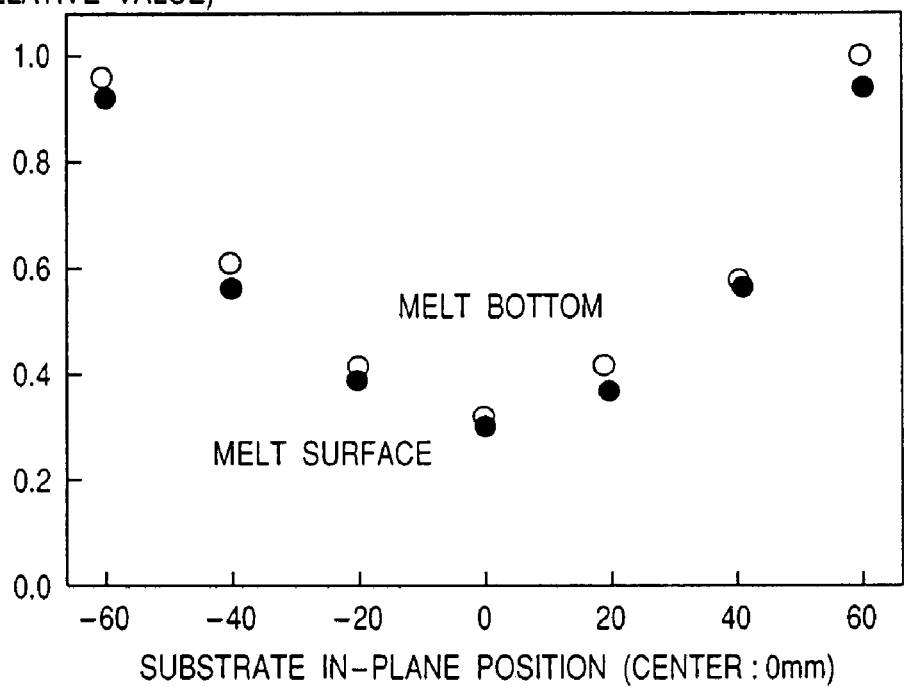
FIG. 3 is a graph showing the in-plane distribution of growth rate where the conventional liquid phase growth system is used.
Figure 4:
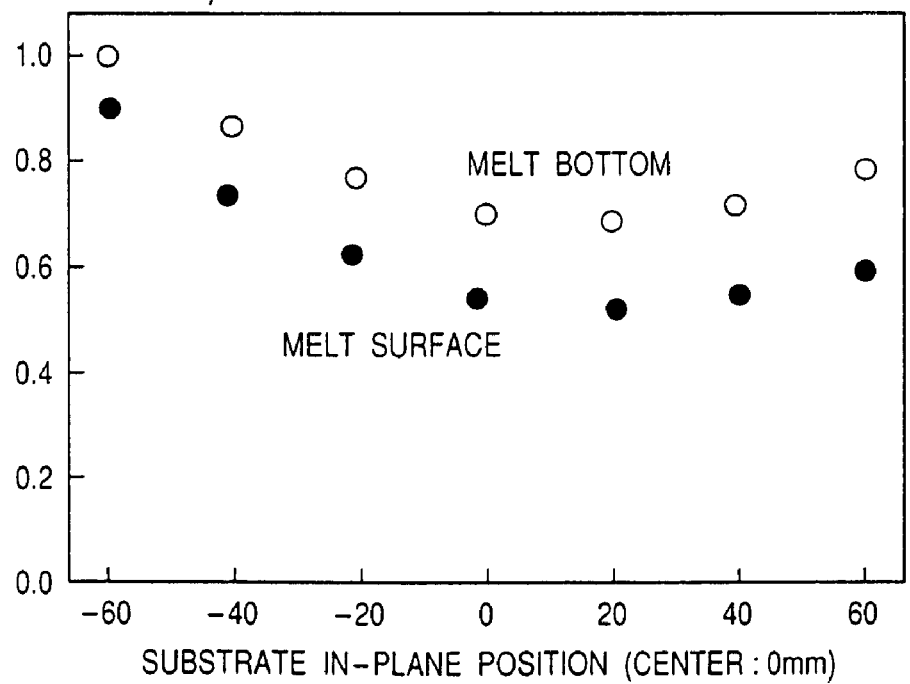
FIG. 4 is a graph showing an example of the in-plane distribution of growth rate where a liquid phase growth system according to the present invention is used.

The in-plane distribution of growth rate in the case where the system shown in FIGS. 1A and 1B is shown in FIG. 4. In FIG. 4, too, white circles indicate distribution on substrates near to the bottom of the melt; and black circles, distribution on substrates near to the surface layer portion of the melt. Compared with the case where the system shown in FIG. 2, the in-plane distribution of growth rate is seen to be fairly improved. However, the growth rate is low as a whole at the surface layer portion, and differences between substrates are seen.

Accordingly, the present inventors prepared a model liquid by mixing ethylene glycol in water to regulate specific gravity and dispersing polystyrene particles therein, and, using it, made observation on how the liquid flows in the crucible when the crucible is rotated.

Figure 5A:
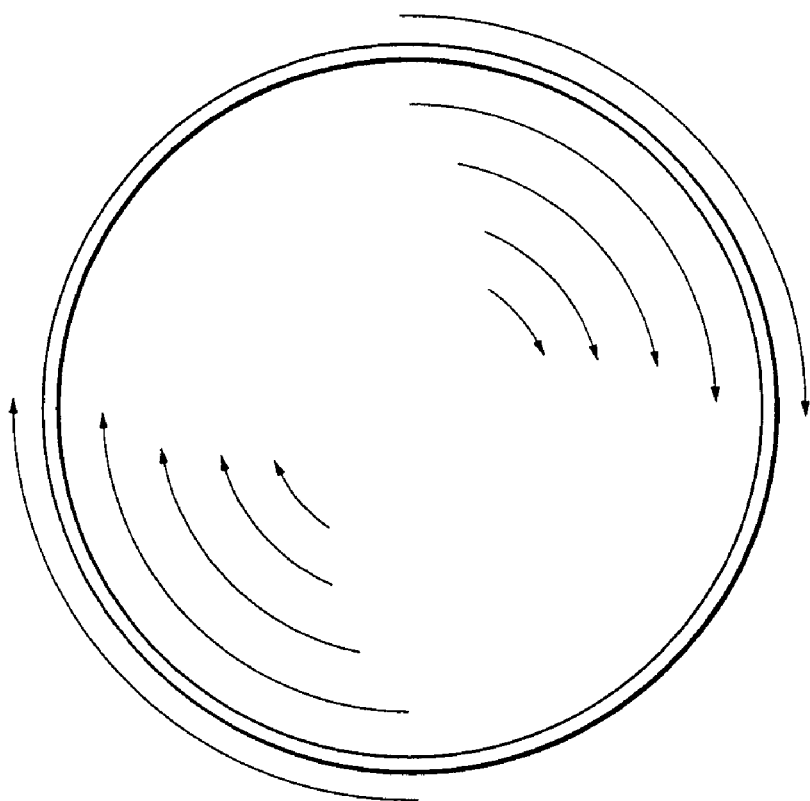
FIGS. 5A and 5B illustrate the flow of a melt where a crucible is rotated.
Figure 5B:
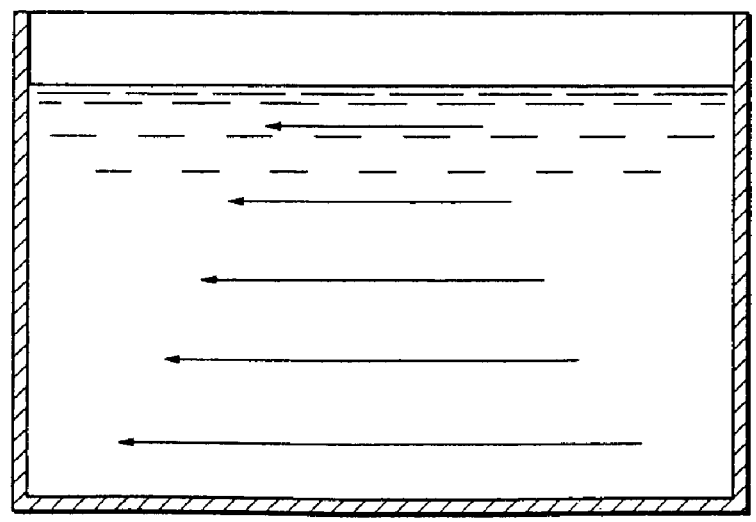

FIG. 5A illustrates the flow of a melt (the liquid) that has been caused by the rotation of the crucible, as viewed from the top. FIG. 5B illustrates the flow of a melt (the liquid) at the part near to the inner wall of the crucible, as viewed from the side. The liquid moves at substantially the same speed at its outward circulation in the vicinity of the bottom of the crucible, but its speed gradually lowers as it approaches the center of rotation of the crucible and/or as it approaches the liquid surface of the melt. Then, this tendency becomes stronger when any article which obstructs the movement of the melt is disposed, like a substrate set stationary in the interior of the melt.

More specifically, any fresh melt containing the crystal material can not sufficiently be supplied as the melt approaches the center of the crucible or as it approaches the surface of the melt, so that the crystal growth rate lowers. In order to prevent this tendency, it is effective to stir the melt. However, when the crystal growth is exposed to a high temperature of about 1,000° C. or when any airtightness to the outside is required, it is not easy to provide a stirring mechanism inside the growth heater.

Figure 6A:
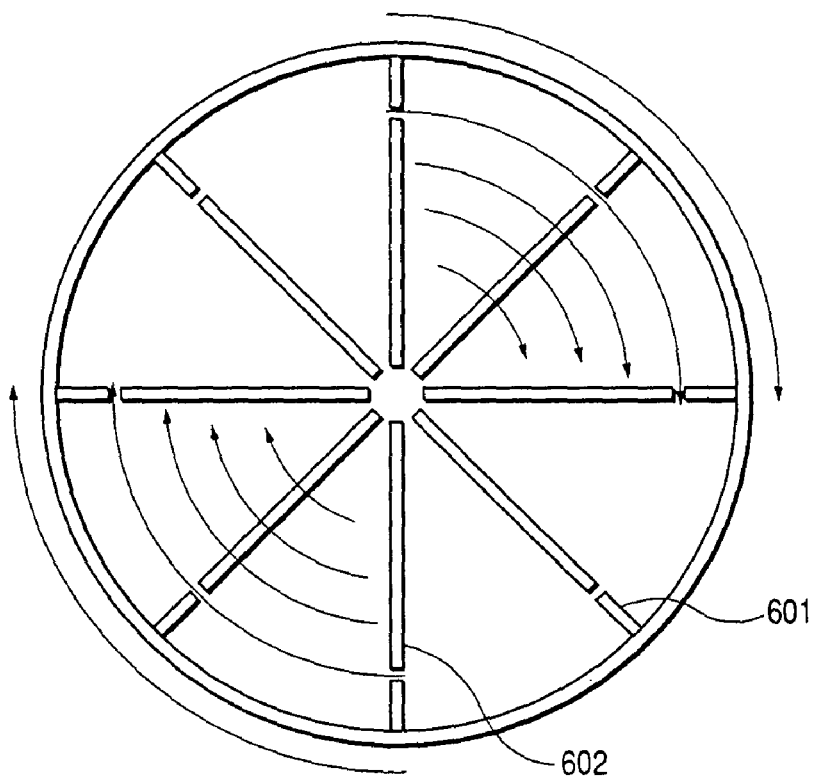
FIGS. 6A and 6B illustrate the flow of a melt where the crucible is rotated according to the present invention.
Figure 6B:
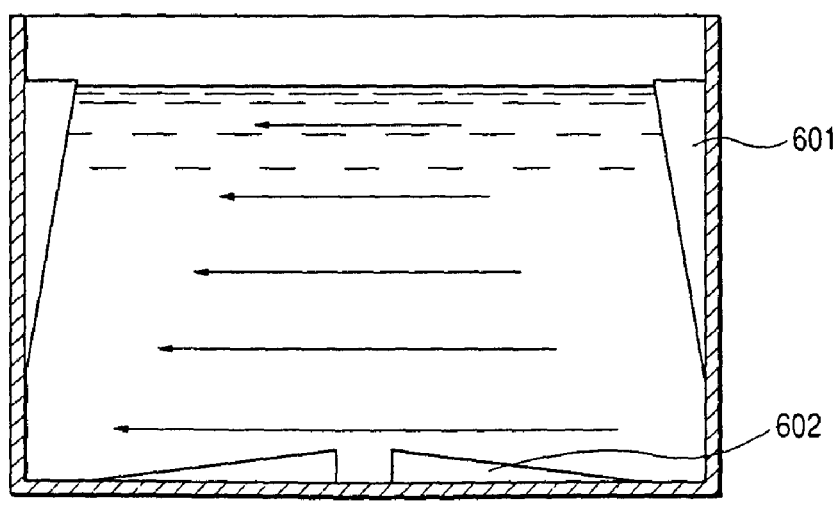

Accordingly, studies have been made on how to make improvement to supplement the flow of melt. An example thereof is described with reference to FIGS. 6A and 6B, which is as follows: The melt is caused to turn by the rotation of the crucible. Its motive force is the friction between the inner wall of the crucible and the melt. Accordingly, in order to accelerate the flow especially at the part the melt flows slowly, a fin 602 which becomes taller toward the center of rotation is provided at the bottom of the crucible and/or a fin 601 which becomes taller toward the top is provided on the inner wall surface of the crucible. Thus, the friction between the bottom or inner wall surface of the crucible and the melt can be made higher and the uniformity of turn of the melt can be improved.

Figure 7:
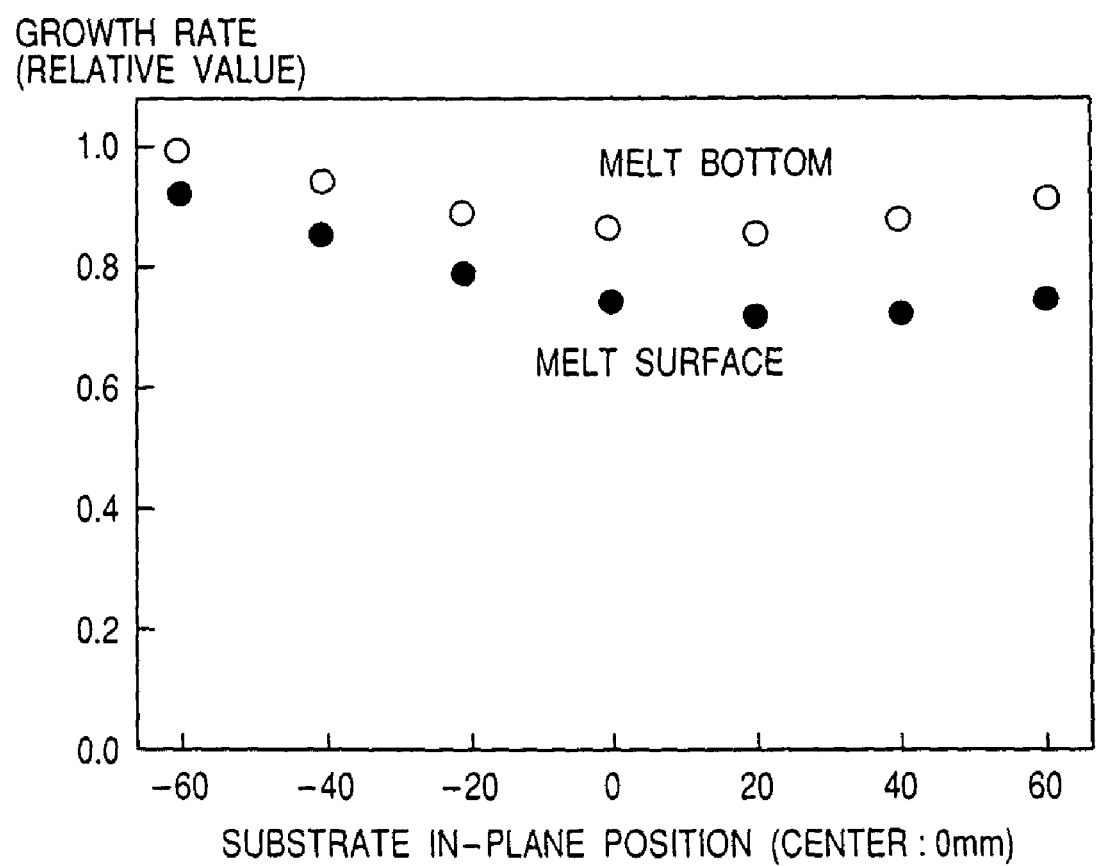
FIG. 7 is a graph showing the in-plane distribution of growth rate where the crucible shown in FIGS. 6A and 6B is used.

FIG. 7 is a graph showing the in-plane distribution of growth rate in the case where the fins 601 and 602 are provided on inner surfaces of the crucible 105 of the system according to the present invention (see FIGS. 1A and 1B). In FIG. 7, too, white circles indicate distribution on substrates near to the bottom of the melt; and black circles, distribution on substrates near to the surface layer portion of the melt. Compared with the case where the crucible having no fins is used, the in-plane distribution is seen to be improved. Here, the fins 601 and 602 may be formed integrally with the crucible. These have simple construction, and are adaptable also to large-sized systems.

Figure 8A:
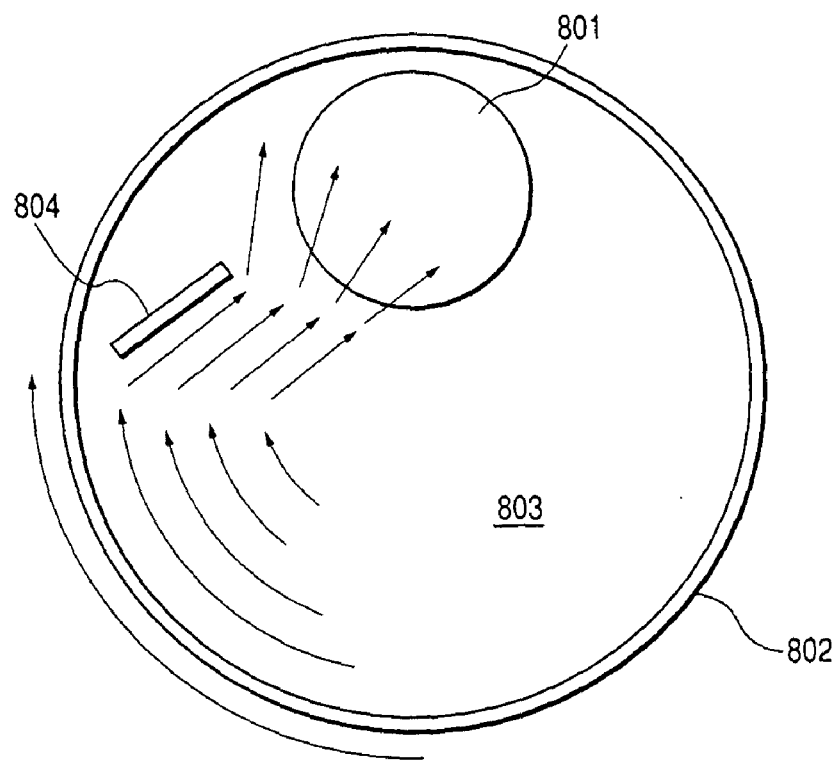
FIGS. 8A and 8B illustrate the flow of a melt where a crucible is rotated using a flow adjusting means according to the present invention.

Another example of the above improvement is described with reference to FIGS. 8A and 8B. In this example, a column of substrate 801 is kept immersed in a melt 803 held in a crucible 802 rotating in the clockwise direction. For convenience of description, however, only one column of substrates is illustrated here in the drawing. FIG. 8A is a plan view showing how the melt flows.

As stated previously, the flow of melt that has been caused by the rotation of the crucible is fast in the vicinity of the inner wall of the crucible and is slow in the vicinity of the center of rotation. Accordingly, a rectifying plate 804 set stationary may be put in the melt, where the flow of the melt at a high speed in the vicinity of the inner wall is guided by the rectifying plate 804 and, after it has been inclined toward the inside of rotation, it is so diffused as to pass through the spaces between substrates at substantially a uniform speed. Also, FIG. 8B is a cross section showing the interior of the crucible. As stated previously, the flow of the melt in the vicinity of the liquid surface is slower than that at the bottom. Accordingly, a rectifying plate 805 set stationary may be put in the melt, where the flow in the vicinity of the bottom is guided to the melt liquid surface, thus the flow of the melt in the vicinity of the liquid surface is accelerated.

Figure 8B:
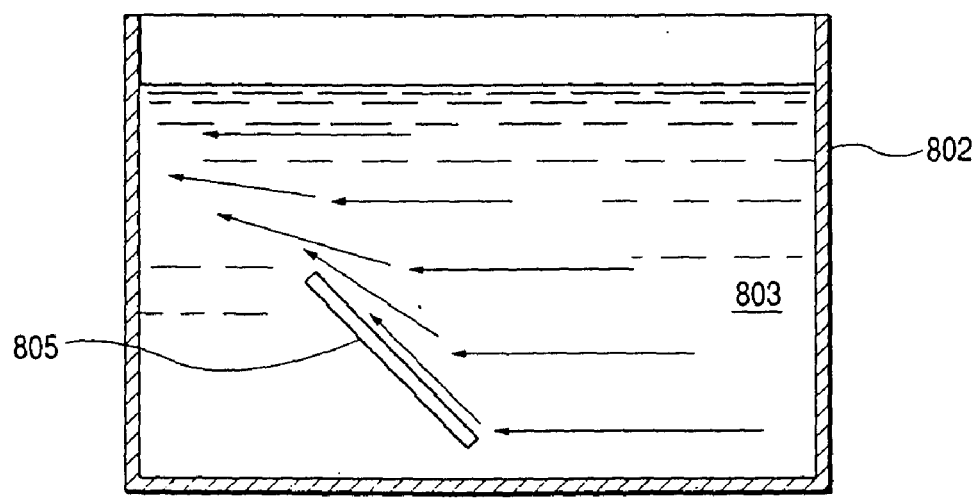

In FIGS. 8A and 8B, for simplification only one rectifying plate 804 or 805 is illustrated. In actual use, four plates for example may equally be disposed around the center of rotation in accordance with the number of the substrate groups. The rectifying plates 804 and 805 may also be used in combination. The use of the rectifying plates 804 and 805 makes the melt flow at substantially a uniform speed in the whole region in which the substrate groups are disposed, and hence it can be expected that the crystal growth rate is also in-plane uniformed.

Figure 9:
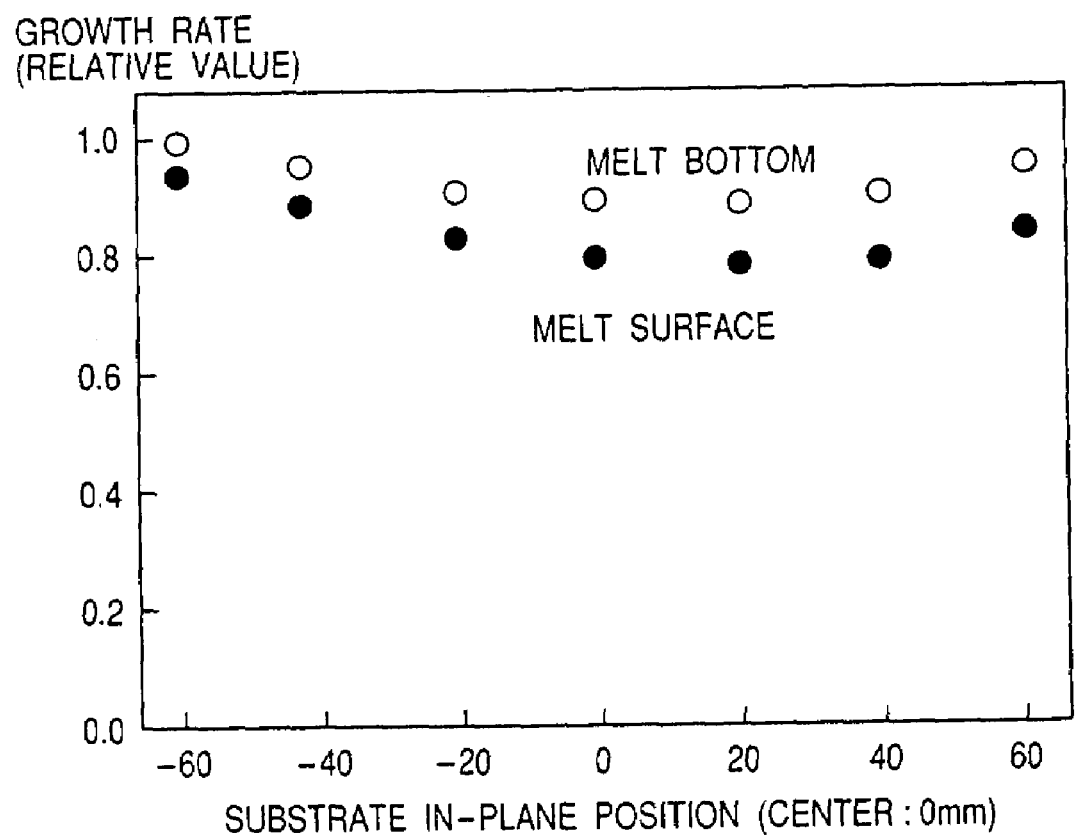
FIG. 9 is a graph showing the in-plane distribution of growth rate where the flow adjusting means shown in FIGS. 8A and 8B is used.

FIG. 9 is a graph showing the in-plane distribution of growth rate in the case where the rectifying plate 804, which rectifies the flow in the horizontal direction, and the rectifying plate 805, which rectifies the flow in the up-and-down direction, are provided on the side upstream to each column of substrates in the system according to the present invention (see FIGS. 1A and 1B). Compared with the case where the above system (FIGS. 1A and 1B) is used, the in-plane distribution is seen to be more improved. Also, the rectifying plates 804 and 805 may be set stationary in the melt, and may be formed integrally with the substrate supporting means. Thus, these do not require any special drive mechanism, and are adaptable also to large-sized systems.

In the method shown in FIGS. 8A and 8B, the crucible is rotated in a fixed direction. Hence, in an attempt to make the growth rate higher, the crystal material tends to deposit, in the substrate area, first on the upstream side of the melt, and the growth rate tends to become slow on the downstream side. To solve this problem, the crystal may be grown while the rotation of the crucible is alternately clockwise and anticlockwise reversed, as reported in A. Giess, Journal of Crystal Growth 31 (1975), 358.

Figure 10A:
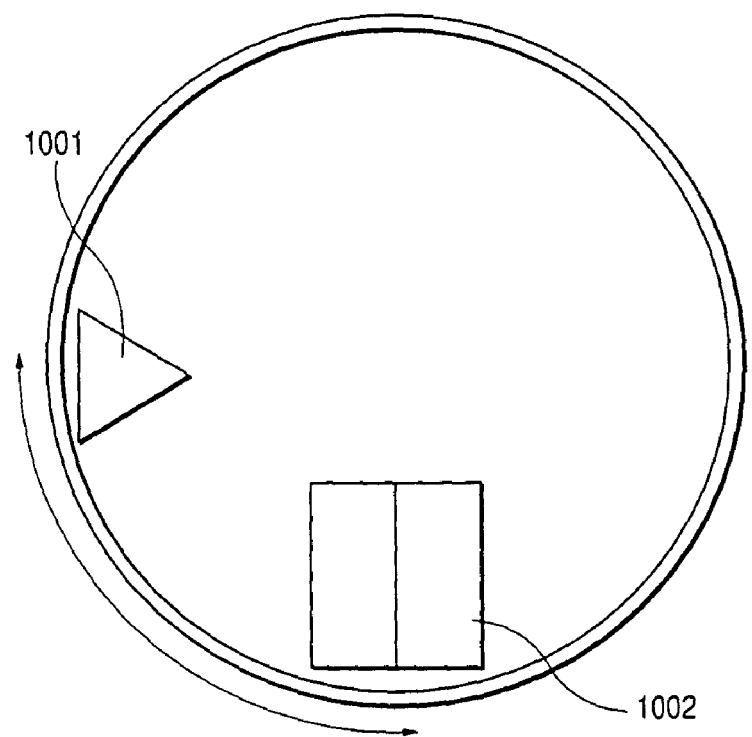
FIGS. 10A and 10B illustrate another flow adjusting means according to the present invention.
Figure 10B:
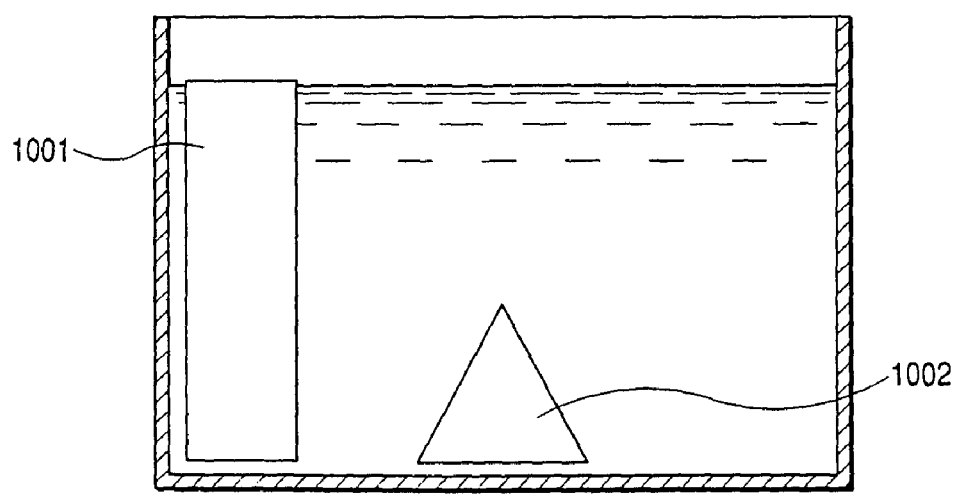

When, however, the rotation is reversed, it follows that the rectifying plate 804 or 805 shown in FIG. 8A or 8B has an inclination which is opposite to the flow. Thus, any intended effect can not be obtained. Accordingly, it has been designed that, as shown in FIGS. 10A and 10B, flow adjusting means 1001 and 1002 are each provided as a member having a shape which is symmetrical to the clockwise and anticlockwise rotations of the crucible. The above problem can be solved by such a means. More specifically, the flow adjusting means 1001 is effective for accelerating the flow of melt at the central portion of the crucible, and the flow adjusting means 1002 is effective for accelerating the flow of melt in the vicinity of the liquid surface. In FIGS. 10A and 10B, for simplification only one set of flow adjusting means is illustrated. In actual use, four means for example may be disposed in accordance with the number of the substrate groups. The flow adjusting means 1001 and 1002 may be used in combination. With such construction, the flow adjusting means can equally be effective for both clockwise and anticlockwise flows of the melt against the clockwise and anticlockwise rotations of the crucible. Hence, this is more effective for making the crystal growth rate uniform.

Figure 11:
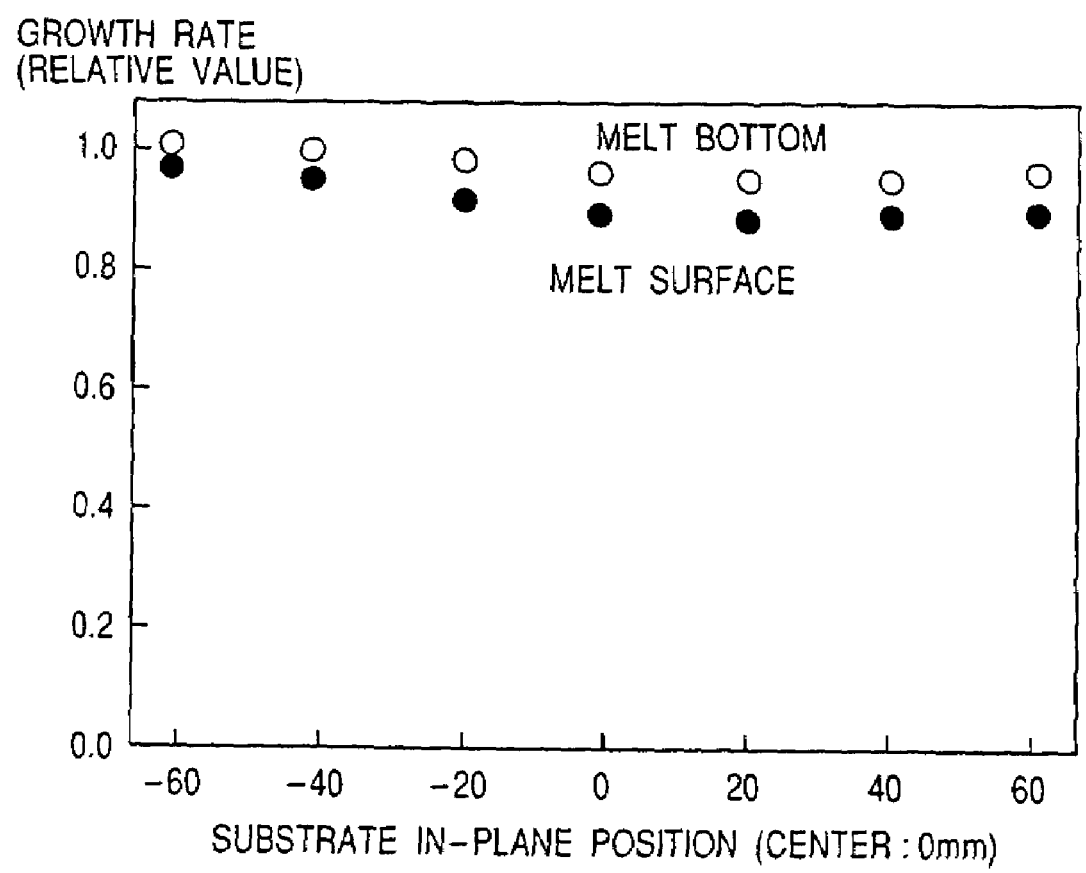
FIG. 11 is a graph showing the in-plane distribution of growth rate where the substrate is caused to move up and down.

In the system shown in FIGS. 1A and 1B, the supporting rack 103 of the substrate supporting means may also be caused to move up and down by means of the up-and-down mechanism 114 during the crystal growth. This further brings about the effect of supplying the melt to the spaces between the substrates. FIG. 11 is a graph showing the in-plane distribution of growth rate in the case where the supporting rack 103 holding the substrates is caused to move up and down by 5 cm six times per minute in addition to the methods shown in FIGS. 6A and 6B or 10A and 10B. There is seen a great improvement.

The present invention is of course applicable to wafers of 3 inches or smaller in diameter, and is suited for film formation on the surfaces of large-area wafers of, e.g., 6 inches, 8 inches and 12 inches in diameter. Also, as what is meant by the "position set aside from the center of rotation of the crucible", stated specifically the substrate may be so disposed that the layer thickness distribution of a film formed on the substrate surface is within 40%, preferably within 20%, and more preferably within 10%.

EXAMPLE 1

Figure 12:
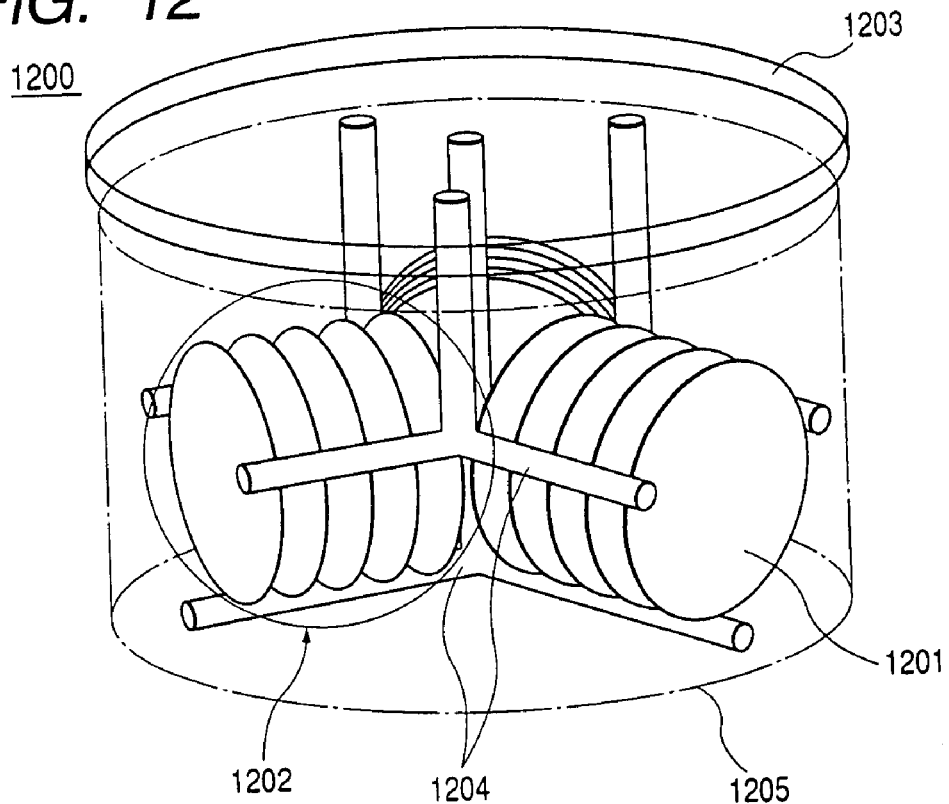
FIG. 12 illustrates an example of a supporting rack of a substrate-supporting means according to the present invention.

In this Example, another case is shown in which substrates are disposed according to the gist of the present invention. The system used is substantially the same as the system shown in FIGS. 1A and 1B, except that the supporting rack 103 of the substrate supporting means has different structure. The substrate supporting means in this Example has the structure as shown in FIG. 12. Here, substrates 1201 are supported with a supporting rack 1200 in the state they are set upright. Five substrates 1201 are supported keeping intervals of 2 cm each as one set, to constitute a substrate group 1202.

The supporting rack 1200 consists of a top plate 1203 and substrate supporting bars 1204 fixed to the top plate. The substrate supporting bars 1204 are each provided with supporting grooves (not shown) formed in a width a little larger than the thickness of each substrate 1201, and the lower edges of the substrates 1201 are fitted in the supporting grooves. Also, the substrate group 1202 are provided in three sets.

Reference numeral 1205 denotes the position of a melt in which the substrates are immersed. Here, three sets of substrate groups are used. Four sets or five sets of substrate groups may also be used, which may appropriately be determined taking account of the size of the substrate, the number of substrates per one set and the size of the crucible.

In the following description, components of the system are denoted by the reference numerals used in the embodiment shown in FIGS. 1A and 1B, but only the members of the supporting rack of the substrate supporting are denoted by the reference numerals used in FIG. 12. First, fifteen 6-inch substrates, stated specifically, p-type polycrystalline silicon wafers 1201', used for the dissolving in the melt 104 were set in the supporting rack 1200 of the substrate supporting means, and were drawn up to the load lock chamber 111 by means of the up-and-down mechanism 114.

Meanwhile, the growth heater 107 was, after the gate valve 110 was closed and flowing hydrogen gas to the inside, heated with the electric heater 108 to make the inside have a temperature of 900° C. In this state, the load lock chamber 111 was moved to the upper part of the gate valve 110. After the inside of the load lock chamber 111 was once evacuated, hydrogen was flowed therein, and then the gate valve 110 was opened. Subsequently, the supporting rack 1200 of the substrate supporting means was little by little descended to immerse the wafers 1201' in the melt. Rotating the crucible 105 at 6 rounds per minute by means of the turn table 106, the wafers 1201' were kept for 30 minutes as they were, to dissolve silicon in the melt 104 to allow it to become saturated.

Thereafter, the gate valve 110 was opened, and the supporting rack 1200 was drawn up from the melt 104. After it was withdrawn into the load lock chamber 111, the gate valve 110 was closed. Then, after the inside of the load lock chamber 111 was displaced with nitrogen gas, the load lock chamber 111 was moved to a substrate-changing position (not shown), where the dissolving substrates 1201' were detached and then fifteen $p^+$-type Cz silicon wafers 1201 of 6 inches in diameter and of the (100)-plane were attached as substrates for crystal growth (growth target substrates).

Then, the load lock chamber 111 was again moved to the upper part of the gate valve 110. After the inside of the load lock chamber 111 was evacuated, hydrogen was flowed therein, and then the gate valve 110 was opened. Subsequently, the supporting rack 1200 of the substrate supporting means was little by little descended until it was descended to the intermediate position substrate-heating position 115, and were heated there to 900° C. Next, the melt was started being cooled at a rate of 1° C./minute. At the time the melt 104 came to 895° C., the supporting rack 1200 was further descended to immerse the wafers 1201 in the melt having become saturated with silicon, and successively the melt was continued being cooled. The wafers 1201 were kept immersed rotating the crucible 105 at 3 rounds per minute. On lapse of 30 minutes, the supporting rack 1200 was drawn up to the substrate-heating position 115, and stopped there for 1 minute to draw off the melt remaining on the wafer surfaces. Then the supporting rack was further drawn up to the inside of the load lock chamber 111, and the gate valve 110 was closed. Next, the inside of the load lock chamber 111 was displaced with nitrogen, and thereafter it was moved to the substrate-changing position, where the growth target wafers (substrates) were detached. On the wafers (substrates) 1201, silicon layers were seen to have been grown epitaxially. Their thickness was measured with a micrometer to find that it was distributed in 30 µm ±10% as in-plane average value of the fifteen wafers, and that, in each substrate also, the crystal thickness was distributed in an error of ±10% on the inner side within 5 mm away from the edge.

For comparison, the crystal growth was carried out in the same manner as the above except that the crucible was not rotated when the crystal material was dissolved in. As a result, the epitaxial layers were in a thickness of 20 µm on the average. This was presumably because the silicon was not well dissolved in the melt in the step of dissolving.

For further comparison, the crystal growth was carried out in the same manner as the above except that the crucible was not rotated when crystals were grown. As a result, the epitaxial layers were in a thickness of 25 µm ±20% as in-plane average value of the fifteen wafers, showing a difference in distribution. In each substrate, the thickness showed a difference in distribution of ±50% on the inner side within 5 mm away from the edge. This was apparently considered to be due to the insufficient flow of melt, which caused a great difference in in-plane distribution of growth rate.

EXAMPLE 2

In this Example, in the same system as that used in Example 1, the intervals of supporting grooves provided in the substrate supporting bars 1104 were narrowed by about 6 mm, where fifteen substrates were set for each substrate group 1202, thus forty-five substrates were held in total in the rack. Then, the epitaxial growth of silicon was carried out according to the same procedure as in Example 1. As a result, it was found that the epitaxial layers were in a thickness showing a difference in distribution of 25 µm ±15% as in-plane average value of the forty-five wafers, and that, in each substrate, the thickness showed a difference in distribution of ±40% on the inner side within 5 mm away from the edge. Namely, this was considered to be due to the substrate intervals narrowed greatly, which made the melt less flow through the spaces between substrates to have caused the difference in in-plane distribution of growth rate.

Figure 13:
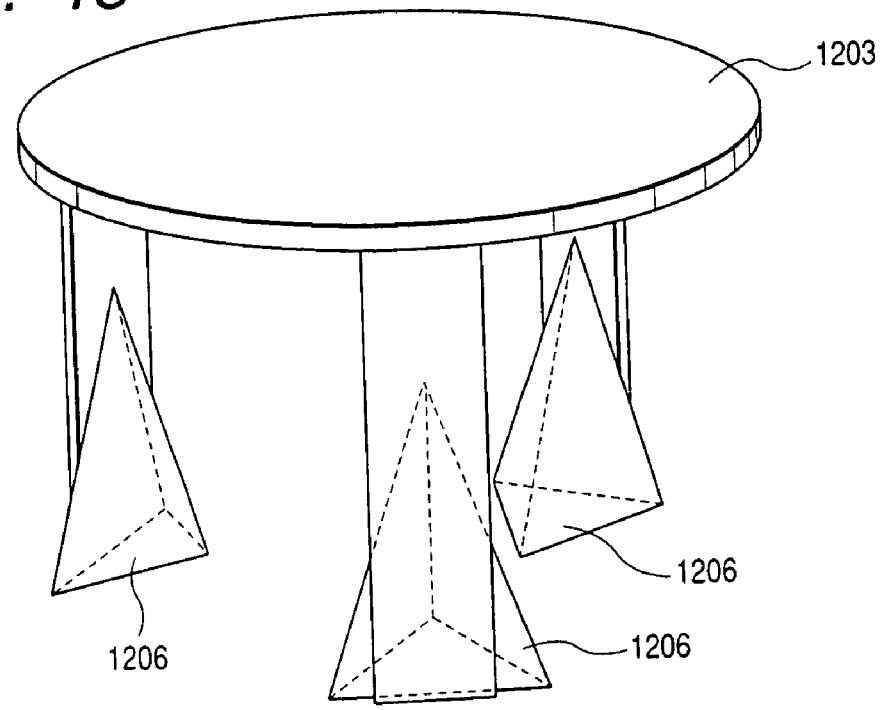
FIG. 13 illustrates still another flow adjusting means according to the present invention.

In this Example, a melt-flow adjusting means was further added. FIG. 13 shows the structure of the melt-flow adjusting means added. Here, corresponding to the three sets of substrate groups, three melt-flow adjusting means 1206 are attached to the top plate 1203 of the supporting rack 1200 of the substrate supporting means. The flow adjusting means 1206 each have a shape which is symmetrical to the directions of both clockwise and anticlockwise turns of the melt in order to deal with the turns in the both directions. One surface of each flow adjusting means has a normal which half extends toward the interior of the crucible and half extends toward the liquid surface of the melt.

Hence, once the flow of melt that has been caused by the rotation of the crucible 105 strikes the surface of a flow adjusting means, the flow is turned aside half toward the inside of the rotation and half toward the liquid surface of the melt. Thus, the flows of melt in the vicinity of the center of rotation and in the vicinity of the liquid surface are accelerated, so that the melt containing the silicon in a high concentration is sufficiently supplied to the substrate surfaces.

The flow adjusting means designed in this way were attached to the supporting rack 1200 of the substrate supporting means, and the growth of silicon was carried out according to the same procedure as in Example 1 except that, when the silicon was dissolved in the melt, the direction of rotation of the crucible was reversed at intervals of 1 minute, during which the crucible was rotated by 6 revolutions for each interval, and, when the silicon was epitaxially grown on the substrates, the direction of rotation of the crucible was reversed at intervals of 1 minute, during which the crucible was rotated by 3 revolutions for each interval.

The epitaxial layers thus grown were in a thickness showing a difference in distribution of 30 µm ±15% as in-plane average value of the forty-five wafers. In each substrate, the thickness showed a difference in distribution of ±10% on the inner side within 5 mm away from the edge. Thus, the uniformity was greatly improved, and it was possible to triple the number of wafers on which silicon was growable per one batch in a system having the same size. It is considered that the reversing of the rotational direction of the crucible and the flow adjusting means 1206 for the flow of melt have brought about the intended effect.

EXAMPLE 3

Figure 14:
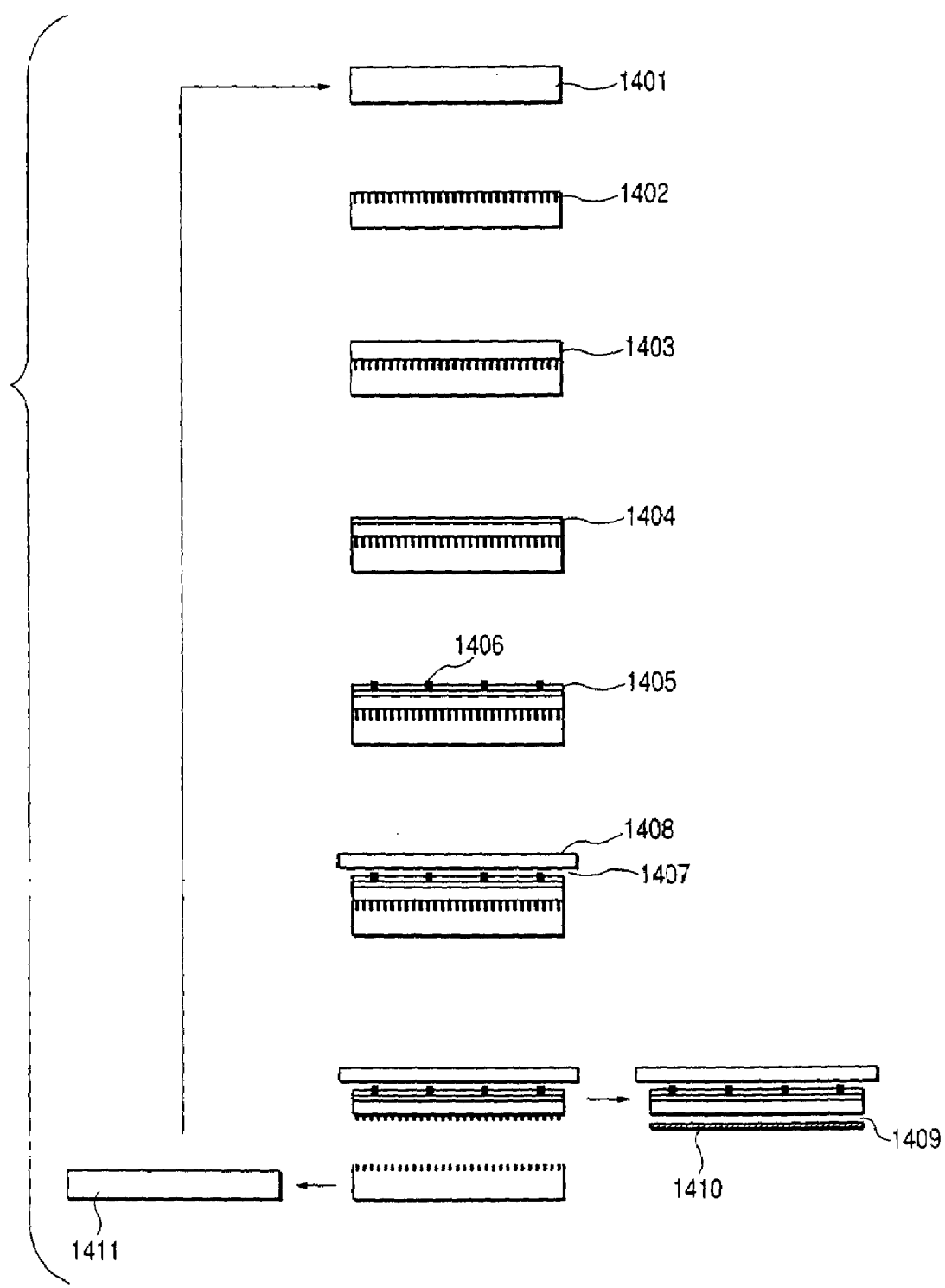
FIG. 14 illustrates an example of a process of producing a solar cell in which the present invention is applied.

In this Example, a process of mass-producing thin-film single-crystal silicon solar cells by using the process of the present invention is described. Details of this solar cell production process are disclosed in Japanese Patent Application Laid-Open No. 10-189924. Its outline is shown in FIG. 14, and is described with reference thereto. In FIG. 14, reference numeral 1401 denotes a p$^+$-type silicon wafer (substrate) of 125 mm square and of the (111)-plane. This wafer is immersed in a hydrofluoric acid solution diluted with ethanol, and a positive voltage is applied thereto to effect anodization.

As a result of this anodization, a porous layer 1402 of 5 µm thick is formed at the surface of the substrate 1401. The porous layer has intricate and entangled fine pores formed therein, but is kept monocrystalline, and epitaxial growth can be effected thereon. Before the epitaxial growth, the substrate is annealed at 1,050° C. in an atmosphere of hydrogen. As a result of this annealing, atoms at the surface of the porous layer are rearranged and the fine pores at the surface are stopped. This is favorable for the epitaxial growth carried out subsequently. On this layer, a p$^-$-type layer 1403 of 30 µm thick is formed by a liquid phase growth process. To form a junction, an n$^+$-type layer 1404 of 30 µm thick is further formed thereon by a liquid phase growth process.

Details of the liquid phase growth process are separately given later. The n$^+$-type layer 1404, however, may instead be formed by, e.g., thermal diffusion of impurities. Next, as a passivation layer a thermal oxide layer 1405 is formed on the surface of the n$^+$-type layer 1404. As an electrode on the surface side, silver paste is further printed in a comb-shaped pattern, followed by baking to form a grid electrode 1406.

As a result of the baking, the pattern formed of silver thrusts through the thermal oxide layer 1405 to come into contact with the n$^+$-type layer 1404. Onto the layers thus formed, a glass substrate 1408 is bonded with an adhesive 1407. Thereafter, the silicon substrate 1401 is fixed, and a force is applied to the glass substrate 1408 to break the part of the porous layer 1402 in which the fine pores have been formed to stand brittle. Thus, the part including the p$^-$-type layer 1403 and its upper layers is separated from the substrate 1401.

On the back of the p$^-$-type layer 1403 thus separated, a residue of the porous layer is left, and hence this is removed by etching. Thereafter, a nickel-plated copper sheet 1410 is bonded thereto with a conductive adhesive 1409. As for the remaining substrate 1401, a residue of the porous layer is also left on its surface, and hence this is also removed by etching to recover its mirror surface. The substrate, 1411, regenerated in this way has come back to the original state except that it has lost its thickness by a little over 5 µm or so, and hence this is returned to the beginning of the process so as to be usable repeatedly. Incidentally, note that in FIG. 14 the porous layer 1402 is illustrated in an extremely large thickness for the demonstration of thickness.

Figure 15:
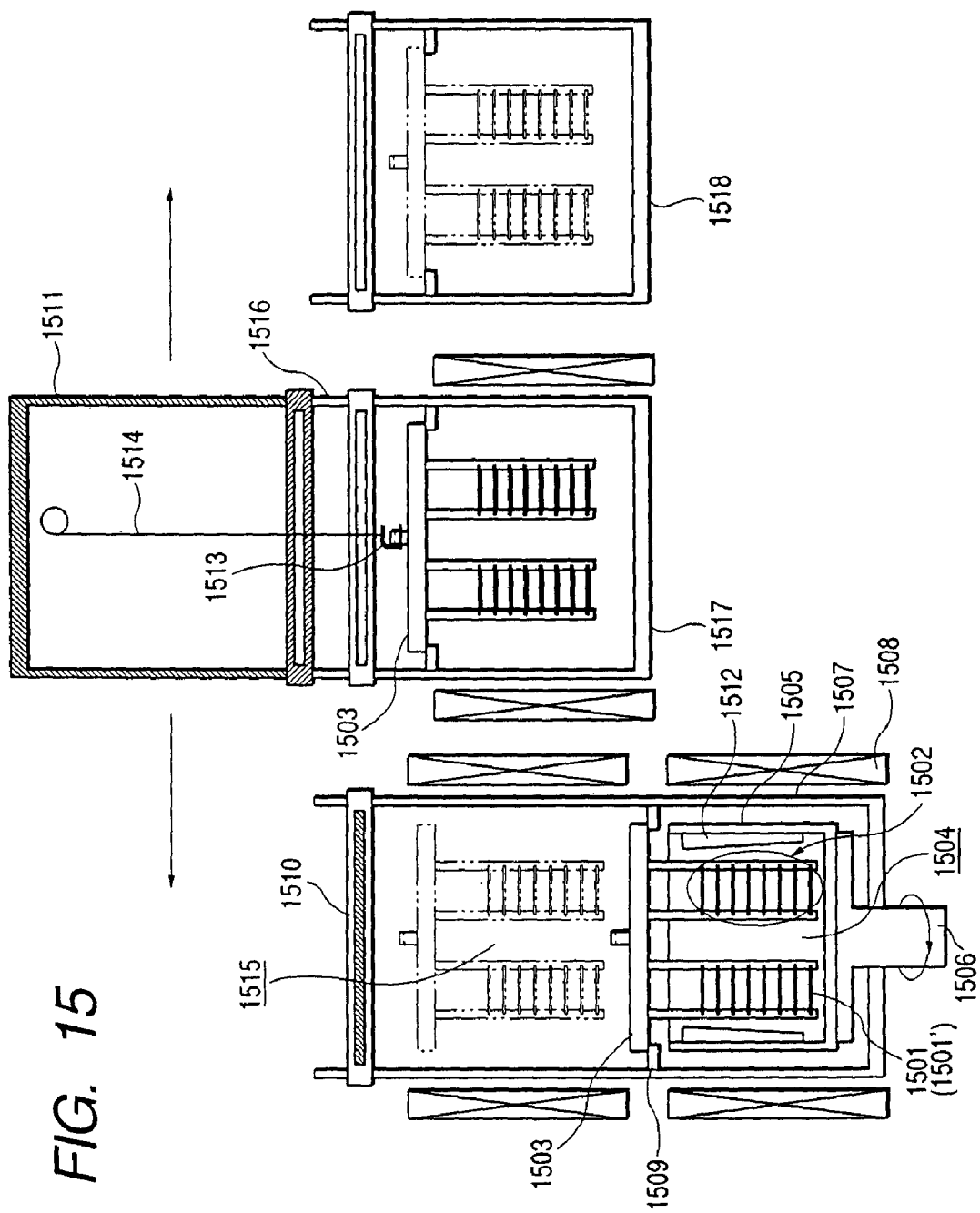
FIG. 15 illustrates a liquid phase growth system according to the present invention, which is suited for the mass production of solar cells.

Next, the construction of a liquid phase growth system for carrying out the epitaxial growth of silicon is described with reference to FIG. 15. Reference numeral 1501 denotes substrates for dissolving (dissolving substrates 1501') or for crystal growth (growth target substrates), and are 125 mm square in size. Fifty substrates are arranged in columns at intervals of 1 cm to constitute a substrate group 1502. Four sets of such a substrate group 1502 are disposed in a supporting rack 1503 like the system shown in FIGS. 1A and 1B. A melt 1504 is held in a crucible 1505 made of quartz glass, placed on a turn table 1506. To the inner wall of the crucible, eight fins 1512 which are each in a greater height toward the top of the crucible are attached at intervals of 45 degrees so that the flow of melt can be caused with ease by the rotation of the crucible. Also, the turn table 1506 is rotatable in the clockwise and anticlockwise directions, and is provided with a sealant at its sliding portion to keep the crucible airtight. The whole of these is held in a growth heater 1507 made of quartz glass.

The temperature of the melt is controlled by an electric-heater heater 1508. A substrate supporting means 1503 can be supported with a supporting member 1509 provided on the inner wall surface of the growth heater 1507. Hence, the growth heater 1507 can be closed with a gate valve 1510 in the course of crystal growth. Here, the gate valve 1510 is so fitted as to be movable in the direction of the back side as viewed in the drawing. Also, in the system of this Example, the growth heater 1507 and a like growth heater (not shown) is provided independently from each other, and the latter is used for the growth of the $n^+$-type layer 1404.

Independently from these heaters, a hydrogen annealing heater 1517 is further provided, for hydrogen-annealing the substrate 1401 where the porous layer 1402 has been formed. In the middle of FIG. 15, shown is how the supporting rack 1503 stands immediately after it has been moved from a load lock chamber 1511 to the inside of the hydrogen annealing heater 1517 by means of an up-and-down mechanism 1514. Thereafter, a hook 1513 is unfastened, and the supporting rack 1503 is received in the load lock chamber 1511, where a gate valve is closed like that of the growth heater 1507, thus the inside can be kept airtight.

A connecting chamber 1516 is also provided which connects the gate valve 1510 of the growth heater 1507 or the gate valve of the hydrogen annealing heater 1517 with the gate valve of the load lock chamber 1511. When the supporting rack 1503 is exchanged between the load lock chamber 1511 and the growth heater 1507 or hydrogen annealing heater 1517, the inside of the connecting chamber 1516 is previously evacuated and thereafter the gate valve is opened. Thus, the substrates can be moved without being contaminated with the open air at all. Reference numeral 1518 denotes a substrate exchange chamber.

A process of carrying out epitaxial growth on the substrate 1401 where the porous layer 1402 has been formed is detailed below. In the system shown in FIG. 15, first, $p^-$-type dissolving substrates 1501' are fitted to the supporting rack 1503, and the supporting rack 1503 holding these substrates is set at the stated position in the substrate exchange chamber 1518.

Next, a gate valve of the substrate exchange chamber 1518 is closed, and its inside is evacuated. Then, to the just upper part of this chamber, the load lock chamber 1511 the inside of which has been evacuated is moved, and the inside of the connecting chamber is also evacuated. Thereafter, the gate valve of the load lock chamber 1511 is opened, and the up-and-down mechanism 1514 provided in the load lock chamber 1511 is operated to put the supporting rack 1503 into the load lock chamber 1511, and its gate valve is closed. Thereafter, the load lock chamber 1511 is moved to the just upper part of the hydrogen annealing heater 1517.

The insides of the load lock chamber 1511 and connecting chamber 1516 are evacuated, and thereafter hydrogen is flowed therein. Meanwhile, the inside of the hydrogen annealing heater 1517 is kept at 1,050° C., and hydrogen is kept flowed therein. At the time the pressure inside the load lock chamber 1511 and that inside the hydrogen annealing heater 1517 have been balanced with each other, the gate valve of the hydrogen annealing heater 1517 is opened, and the supporting rack 1503 is descended, where it is held for 10 minutes. As a result of this operation, natural oxide films present on the surfaces of the dissolving polycrystalline silicon 1501' are removed.

Thereafter, the supporting rack 1503 is fastened to the hook 1513, and is drawn up with the up-and-down mechanism 1514, where the gate valve of the hydrogen annealing heater 1517 and the gate valve of the load lock chamber 1511 are closed. Subsequently, the load lock chamber 1511 is moved to the just upper part of the growth heater 1507. Here, too, the inside of the connecting chamber is evacuated, and thereafter hydrogen is flowed therein. Then the gate valve of the load lock chamber 1511 and the gate valve of the growth heater 1507 are opened, and the supporting rack 1503 is descended to a substrate-preheating position 1515 inside the growth heater 1507, which was heated there to 955° C. and then immersed in a melt 1504 kept at 955° C. Here, the supporting rack 1503 is supported in the state it is put on the supporting member. Hence, the hook 1513 may be unfastened to allow the up-and-down mechanism 1514 to be put away into the load lock chamber 1511, where the gate valve 1510 can be closed. In this state, the turn table 1506 is rotated at 6 rounds per minute, repeating the forward rotation and the backward rotation alternately at intervals of 1 minute to make the silicon dissolve in the melt 1504.

In that course, another substrate supporting means to which $n^+$-type dissolving polycrystalline silicon wafers have been fitted is set in the substrate exchange chamber 1518, to make silicon and a dopant dissolve in another melt 1504 held in the $n^+$-type silicon growth heater (not shown). Usually, the amount of silicon consumed in the crystal growth carried out once is much smaller in the case of $n^+$-type than in the case of $p^-$-type, and hence the dissolving is completed in a short time.

Next, (111)-plane $p^{30}$-type silicon wafers 1501 (corr. to 1401) are fitted to a supporting rack, and this supporting rack is further set in the substrate exchange chamber 1518. Like the case of dissolving, hydrogen annealing is first carried out in the hydrogen annealing heater 1517. Subsequently, the growth of $p^-$-type layers 1403 is carried out in the growth heater. In that case, the substrates 1501 are heated to 955° C. at the substrate-preheating position 1515, and thereafter the melt is cooled at a rate of 1° C./minute.

At the time the melt came to 950° C., the supporting rack is descended to immerse the substrates 1501 in the melt, where the crystal growth was carried out for 30 minutes. In that course, the supporting rack is rotated at 3 rounds per minute, and its forward rotation and backward rotation are alternately repeated at intervals of 1 minute. Thereafter, the supporting rack 1503 is drawn up, and $n^+$-type layers 1404 are formed in the $n^+$-type silicon growth heater (not shown). In this case, the melt is started being cooled from 855° C. at a rate of −0.5° C./minute, and the crystal growth is started at the time the melt came to 850° C., and is completed on lapse of 3 minutes. Meanwhile, in the course of the crystal growth of the $n^+$-type layers 1404, the dissolving of silicon is started in the next $p^-$-type layer growth heater 1507 so that the melt can be prepared for the next crystal growth.

Cross sections of the substrates on which the crystal growth was thus completed were observed by SEM (scanning electron microscopy) to ascertain the total thickness of the p$^-$-type layer 1403 and n$^+$-type layer 1404, and the thickness of the n$^+$-type layer 1404 was measured by SIMS (secondary ion mass spectroscopy). According to the results obtained, the difference in thickness between the center of each substrate and the position of 5 mm away from the peripheral edge was within ±10% in respect of the p$^-$-type layer 1403, and within ±5% in respect of the n$^+$-type layer 1404.

Solar cells formed by the process shown in FIG. 14 also showed conversion efficiency in a distribution of ±1%, which was found very good. In addition, according to the system of this Example, the annealing, crystal growth and dissolving can be carried out in the state the annealing heater and the growth heater are closed. Hence, not only a plurality of heaters can efficiently be used, but also there is less possibility of any unwanted contamination that may come from the load lock chamber and so forth during the crystal growth.

In the foregoing Examples, only the case of silicon has been described. Needless to say, the process of the present invention is applicable not only to the liquid phase growth of semiconductors but also to that of other crystal materials.

As described above, according to the present invention, the effect of making the substrate in-plane crystal thickness uniform can be obtained. Also, crystals with uniform thickness can be formed on a large number of substrates by liquid phase growth, using a simple mechanism. Still also, there is less possibility of any contamination that may come from the growth system during the liquid phase growth. Still also, when the processing is carried out in plurality as in the annealing and the crystal growth, the substrates can efficiently be exchanged between the heaters where the processing is carried out in plurality, and hence the throughput of crystal growth can be improved.

What is claimed is:

1. A liquid phase growth process comprising the steps of:
   immersing a plurality of substrates in a melt held in a crucible, a crystal material having been dissolved in the melt; and
   growing a crystal on a surface of each of the plurality of substrates,
   wherein the crucible is rotated independently from the plurality of substrates during crystal growth,
   wherein each of the plurality of substrates is disposed at a position set aside from the center of rotation of the crucible, and the crystal is grown on the surface of each of the plurality of substrates thus disposed,
   wherein no part of the plurality of substrates is disposed at the center of rotation of the crucible, and
   wherein the plurality of substrates extends outwardly in a common radial direction from the axis of the center of rotation of the crucible, such that each of the plurality of substrates is set upright.

2. A substrate member production method comprising the steps of:
   immersing a plurality of substrates in a melt held in a crucible, a crystal material having been dissolved in the melt; and
   growing a crystal on a surface of each of the plurality of substrates,
   wherein the crucible is rotated independently from the plurality of substrates during crystal growth,
   wherein each of the plurality of substrates is disposed at a position set aside from the center of rotation of the crucible, and the crystal is grown on the surface of each of the plurality of substrates thus disposed,
   wherein no part of the plurality of substrates is disposed at the center of rotation of the crucible, and
   wherein the plurality of substrates extends outwardly in a common radial direction from the axis of the center of rotation of the crucible, such that each of the plurality of substrates is set upright.

* * * * *

UNITED STATES PATENT AND TRADEMARK OFFICE
CERTIFICATE OF CORRECTION

PATENT NO. : 7,022,181 B2
APPLICATION NO. : 10/014418
DATED : April 4, 2006
INVENTOR(S) : Katsumi Nakagawa et al.

It is certified that error appears in the above-identified patent and that said Letters Patent is hereby corrected as shown below:

TITLE PAGE: item
(56) References Cited FOREIGN PATENT DOCUMENTS (page 2),
line 1, "57095893" should read -- 57-95893 --;
line 4, "11199376" should read -- 11-199376--; and
line 5 "11228280" should read -- 11-228280 --.

COLUMN 5:
Line 1, "intervals" should read -- intervals from --.

COLUMN 6:
Line 27, "substrate" should read -- substrates --.

COLUMN 9:
Line 57, "group" should read -- groups --.

COLUMN 14:
Line 30, "turn table" should read -- turntable --;
Line 44, "$p^{30}$-type" should read -- $p^+$-type --; and "(corr." should read
-- (corresponding --.

Signed and Sealed this

Ninth Day of January, 2007

JON W. DUDAS
*Director of the United States Patent and Trademark Office*